United States Patent [11] 3,618,126

[72] Inventors Carl W. Gerst
Skaneatles;
Thomas L. Sly, Clay, both of N.Y.
[21] Appl. No. 822,974
[22] Filed May 8, 1969
[45] Patented Nov. 2, 1971
[73] Assignee Anaren Microwave, Inc.
Syracuse, N.Y.

[54] MICROWAVE SIGNAL AMPLIFIER WITH FEEDBACK
10 Claims, 2 Drawing Figs.

[52] U.S. Cl. .......... 330/53, 330/85, 333/10
[51] Int. Cl. .......... H03f 3/60, H03f 1/36, H01p 5/14
[50] Field of Search .......... 330/53, 11, 56; 333/10

[56] References Cited
UNITED STATES PATENTS
2,825,764 3/1958 Edwards et al. .............. 330/53 X

*Primary Examiner*—Nathan Kaufman
*Attorney*—Camil P. Spiecens

ABSTRACT: A microwave signal amplifier includes a common emitter transistor amplifier for transmitting a microwave signal from a source of microwave signals to a microwave utilization device. The transistor is connected in series with a phase shifting means between one output port and one input port of a four-port quadrature coupler. The input microwave signal is received at the other input port and the amplified microwave signal is transmitted from the other output port of the coupler.

FIG.2

Figures 1, 2:
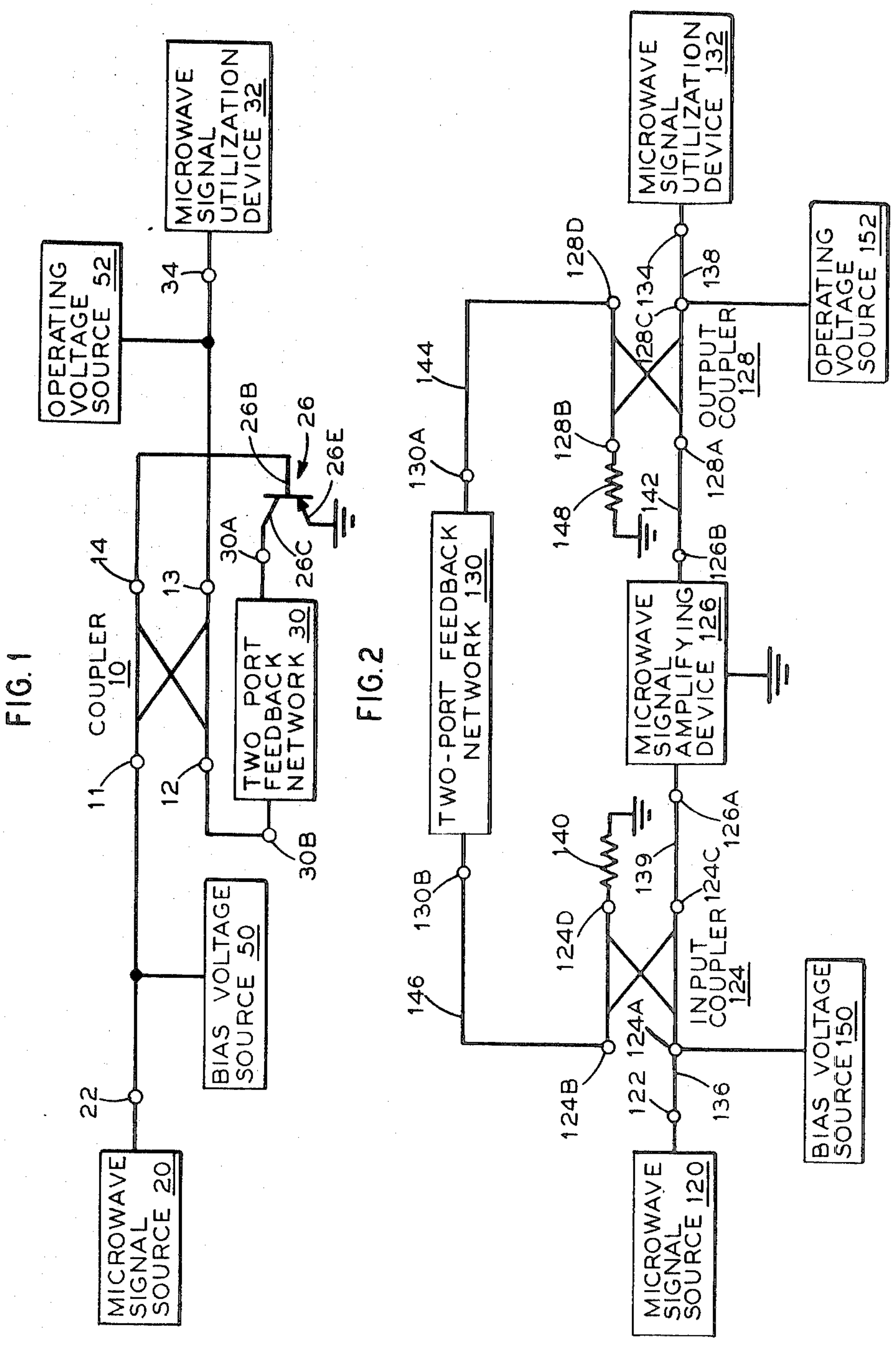

INVENTORS
Carl W. Gerst
Thomas L. Sly
BY [signature]
ATTORNEY

MICROWAVE SIGNAL AMPLIFIER WITH FEEDBACK

This invention pertains to microwave signal amplifiers and more particularly to such amplifiers having feedback.

In many signal amplifiers it is common for the amplification of signals to fall off with increasing frequency. With microwave signal amplifiers using transistors, unless compensated for, the amplification factor is highly frequency dependent because of the shunt capacitances in the amplifier. Accordingly, microwave signal amplifier designers try to introduce compensation in their design. When transistors are used as the active devices, controlled mismatches are purposely introduced on the input and output sides of the transistor amplifiers. These mismatches produce a feedback through the transistor which is used to achieve the compensation. However, such techniques are burdensome to carry out and are usually only moderately effective over limited ranges of frequency.

It is accordingly a general object of the invention to provide an improved microwave signal amplifier having a flat frequency response over a broad band of frequencies.

It is another object of the invention to provide a microwave signal amplifier wherein feedback is provided via a path external to the active device.

It is a further object of the invention to satisfy the above-cited objects with a microwave signal amplifier that is simple and inexpensive to produce.

Briefly, the invention contemplates a microwave signal feedback amplifier comprising at least one microwave signal coupler, a microwave signal amplifying means and a microwave signal phase shifter. The coupler has first and second input ports and first and second output ports. The coupler is so constructed that microwave signal power applied to one of the input ports is transmitted from both of the output ports and microwave signal power applied to the other of the input ports is also transmitted from both of the output ports. The first input port receives the input signal to be amplified and the first output port transmits the amplified output signal. Means serially connect the microwave signal amplifying means and the microwave phase shifting means between the second output port and the second input port of the coupler.

Other objects, the features and advantages of the invention will be apparent from the following detailed description when read with the accompanying drawing which shows, by way of example, and not limitation, microwave signal feedback amplifiers in accordance with the invention.

FIG. 1 is a schematic representation of one embodiment of the microwave signal feedback amplifier in accordance with the invention; and FIG. 2 is an other embodiment of the microwave signal feedback amplifier in accordance with the invention.

Before proceeding with a description of the feedback amplifiers of FIG. 1 and FIG. 2, a building block thereof will be described. Coupler 10 of FIG. 1 has four ports 11, 12, 13 and 14. The coupler is linear and reciprocal. The coupler also has a given bandpass and has a characteristic impedance at the ports. Unless otherwise indicated, the microwave signal energy has frequencies within the bandpass of the coupler and the devices connected to the couplers have input and output impedances which match the characteristic impedances of the couplers. For the sake of definiteness the ports 11 and 12 are considered to be the input ports of the coupler and the ports 13 and 14 are considered to be the output ports of the coupler. Because of the reciprocal nature of the coupler, the input ports and output ports can be interchanged.

If a microwave signal is received at the first input port 11 the power or energy of the signal is split into two quantities. One quantity is fed to the first output port 13 and the other is fed to the second output port 14. The signal phase of the power transmitted from output port 13 is advanced by 90 electrical degrees or one-quarter of an operating wavelength from the signal phase of the power transmitted from output port 14. Thus, if the microwave power received at input port 11 is represented by the quantity A, the ports 13 and 14 transmit microwave energy having voltages represented by the quantities $+jA/n$ and $$\sqrt{1-\frac{1}{n}2A}$$

respectively, where $n$ is a number greater than 1 and $j$ is the complex operator. Similarly, if a microwave signal is received at the second input port 12, the power of the signal is split into two quantities. The signal phase of the power transmitted from output port 14 is delayed by 90 electrical degrees or one-quarter of an operating wavelength from the signal phase of the power transmitted from output port 13. Thus, if the microwave power received at input port 12 is represented by the quantity B, the ports 13 and 14 transmit microwave power having voltages represented by the quantities $$\sqrt{1-\frac{1}{n}2B}$$

and $+jB/n$, respectively. If microwave signal power is simultaneously applied to input ports 11 and 12, signal superposition occurs because the coupler is linear. Therefore, by using the above indicated terminology, when microwave power received at input port 11 is represented by A and the microwave power received at input port 12 is represented by B, output port 13 transmits microwave power having a voltage represented by $$\frac{+jA}{n}+\sqrt{1-\frac{1}{n}2B}$$

and output 14 transmits microwave power having a voltage represented by $$\sqrt{1-\frac{1}{n^2}}A+\frac{jB}{n}.$$

Hence, the meaning quadrature coupler or 90 degree hybrid. It should be noted that the input ports be isolated from each other and that the signals received at two input ports superimpose at, at least, one output port. Preferably, the input port 11 is direct current connected to output port 14 and alternating current coupled to output port 13. Similarly input port 12 is direct current connected to output port 13 and alternating current coupled to output port 14.

There are several ways of physically realizing the coupler. The most practical way is with a coupled transmission line coupler using striplines or microstrip lines. A stripline coupler having a broad bandwidth is shown and described in the copending application Ser. No. 737,745, filed June 17, 1968 for Broadband Microwave Phase Shifter, and assigned to the same assignee. Other suitable couplers can be found in the article "Coupled-Transmission-Line Direction Couplers" by J. K. Shimizu and E. M. T. Jones, at pages 403 to 410 of the IRE Transactions on Microwave Theory and Techniques of Oct. 1958.

In FIG. 1 there is shown a microwave signal feedback amplifier connecting a microwave signal source 20 to a microwave signal utilization device 32. The feedback amplifier comprises port 10, a signal amplifier in the form of a transistor 26 and a two port feedback network 30.

In particular, the output port 22 of signal source 20 is connected to a first input port 11 of coupler 10 and the input port 34 of utilization device 32 is connected to a first output port 13 of coupler 10. The phase shift network 30 and the transistor 26 are serially connected between the second output port 14 and the second input port 12 of coupler 10. While transistor 26 is shown as a common emitter amplifier with its base terminal (input terminal) 26B connected to output port 14, its emitter terminal (common terminal) 26E connected to ground and its collector terminal (output terminal) 26C connected to input terminal 30A of network 30, the common base configuration of the transistor could also be used.

In any event, the output port 14 of coupler 10 is connected to the base terminal 26B of transistor 26. The emitter terminal 26E of transistor 26 is grounded and the collector terminal 26C thereof is connected to input port 30A of feedback network 30. The output port 30B of network 30 is connected to input port 12 of coupler 10. In operation, an input signal received at input port 11 is fed primarily to output port 14 of coupler 10. The signal transmitted from output port 14 is amplified by transistor 26 and phase shifted by network 30 and fed to input port 12. The major portion (the output signal) of the signal received at input port 12 is transmitted from output port 13 to utilization device 32 and a minor portion (the feedback signal) is transmitted from output port 14, being superimposed on the from input port 11, to the base terminal 26B of transistor 26. The feedback network 30 can be a length of stripline whose phase shift and attenuation is frequency dependent.

When coupler 10 has a direct current connection between one input port and one output port and there is only alternating current coupling to the other output port, an advantage is gained in applying operating power to the transistor 26. In particular, bias voltage source 50 is connected to input port 11. Of course, there should be direct current isolation between bias voltage source 50 and microwave signal source 20 and alternating-current decoupling in source 50. In such a case, the bias voltage is applied from input port 11 via the direct current path through coupler 10 to output port 14 and then to the base of transistor 26. Similarly, collector voltage is applied to collector 26C of transistor 26 by connecting operating voltage source 52 to output port 13 so that the collector voltage is applied via the direct current connection between ports 13 and 12 and phase shift network 30 to the collector 26C.

Refer now to FIG. 2. The microwave signal transmission system comprises a microwave signal source 120 having an output port 122 from which are transmitted microwave signals to be amplied; a microwave signal amplifier comprising input coupler 124 with input port 124A (the input to the amplifier), microwave signal amplifying device 126, output coupler 128 with output port 128C (the output of the amplifier), and two-port feedback network 130; and microwave signal utilization device 132 having an input port 134 for receiving signals amplified by the amplifier. Output port 122 of source 120 is connected via transmission line 136 to input port 124A; and output port 128C of output coupler 128 is coupled via transmission line 138 to input port 134 of utilization device 132. Thus, signals transmitted from output port 122 of source 120 are amplified and received at the input port 134 of utilization device 132.

The amplifier, per se, will now be described. Input coupler 124 feeds signals received from signal source 120, at input port 124A, and signals from feedback network 130, at input port 124B, to the output ports 124C and 124D. Recalling the operation of a coupler, as described with respect to FIG. 1, portions of the received signals, superimposed, are fed to both the output ports. The output port 124C is connected, via transmission line 139, to the input port 126A of amplifying device 26. Thus amplifying device 126 receives a portion of a feedback signal received at input port 124B and the signal to be amplified received at input port 124A of coupler 124. However, at the same time, output port 124D of coupler 124 is transmitting similar signals. Therefore, in order to prevent undesired signal reflections port 124D is terminated with a microwave signal dissipation device 140 which can be a microwave resistor having a resistance equal to the output impedance of port 124D.

Microwave signal amplifying device 126 can be a microwave transistor amplifier of the common base of common emitter configuration. In the common base configuration, the base terminal of the transistor is grounded and the emitter terminal connected to input port 126A; in the common emitter configuration the emitter terminal of the transistor is grounded and the base terminal connected to input port 126A. For either configuration the collector terminal of the transistor is connected to the output port 126B.

Transmission line 142 connects output port 126B to the input port 128A of output coupler 128. Amplified signals received at input port 128A, after power splitting, are transmitted from both output ports 128C and 128D of output coupler 128. The portion of the signal transmitted from port 128C is fed to utilization device 132. The portion of the signal transmitted from port 128D (the feedback signal) is fed, via transmission line 144, to input port 130A of two-port feedback network 130. (Note: input port 128B of coupler 128 is terminated with a microwave signal dissipation means 148, such as a resistor having a resistance equal to the output impedance of the port to prevent reflections).

Feedback network 130 can comprise both resistive and reactive elements to have a desired frequency response so as to control the amplitude of the signal fed via its output port 130B and transmission line 146 back to input coupler 124. However it is more desirable to control the amplitude of the feedback signal by controlling the coupling ratio of the couplers. Such feedback networks are well known and will not be described except to note that conventional microwave components such as lengths of stripline would be employed. In addition, proper phasing devices such as delay lines or phase shifters would be employed to insure the proper phase of the feedback signal is received at input port 26A. In general, negative feedback will be employed with the degree of feedback being reduced as the frequency of the input signals goes up.

Just as with the embodiment of Figure 1, operating power for the signal amplifying device can be obtained by connecting a bias voltage source 150 to input port 124A of coupler 124, and by connecting an operating voltage source 152 (collector supply voltage) to output port 128C of coupler 128.

What is claimed is:

1. A microwave signal feedback amplifier comprising a microwave signal coupler, said coupler having first and second input ports and first and second output ports wherein microwave signal power applied to said first input port is transmitted from at least said first output port and microwave signal power applied to said second input port is transmitted from both of said output ports, said first input port being adapted to receive an input microwave signal, said second output port being adapted to transmit an output microwave signal, a microwave signal amplifying means having an input terminal and an output terminal, and microwave signal feedback means including a phase shifter connecting the input terminal of said microwave signal amplifying means to said first output port and the output terminal of said microwave signal amplifying means to said second input port for feeding back a portion of a microwave signal at said first output port to said second input port.

2. The microwave signal amplifier of claim 1 wherein said microwave signal feedback means includes a further coupler.

3. The microwave signal feedback amplifier of claim 1 wherein said coupler is a quadrature coupler so that the signals transmitted from said output ports have a 90° phase difference.

4. The microwave signal feedback amplifier of claim 1 wherein said first input port is direct current connected to said first output port and alternating current coupled to said second output port, and said second input port is direct current connected to said second output port and alternating current coupled to said first input port.

5. The microwave signal feedback amplifier of claim 4 wherein said microwave signal amplifying means comprises a microwave signal amplifier having an input terminal connected to said first output port and an output terminal connected to said second input port, and further comprising an operating power source connected to at least said first input port whereby operating power is applied to at least one terminal of said microwave signal amplifier via a direct current connection through said coupler.

6. The microwave signal feedback amplifier of claim 4 wherein said microwave signal amplifying means comprises a microwave signal amplifier having an input terminal connected to said first output port, an output terminal connected to said second input port and a common terminal, and further comprising a bias voltage source connected to said first input port whereby a bias voltage is applied to the input terminal of said microwave signal amplifier via the direct current connection between said first input port and said first output port, and an operating voltage source connected to said second output port whereby an operating voltage is applied to the output terminal of said microwave signal amplifier via the direct current connection between said second output port and said second input port.

7. A microwave signal feedback amplifier comprising: first and second microwave signal couplers, each of said couplers having first and second input ports and first and second output ports, said ports being so connected that signals received by either one of said input ports are transmitted to both of said output ports and said input ports being isolated from each other, the first input port of said first coupler being adapted to receive a microwave signal from a source of microwave signals, the first output port of said second coupler being adapted to transmit a microwave signal to a microwave signal utilizing means; a first microwave signal dissipation means connected to the second output port of said first coupler; a second microwave signal dissipation means connected to the second input port of said second coupler; a microwave signal amplifying means having an input port and an output port; means for connecting the input port of said microwave signal amplifying means to the first output port of said first coupler; means for connecting the output port of said microwave signal amplifying means to the first input port of said second coupler; a microwave signal feedback network having an input port and an output port; means for connecting the input port of said microwave signal feedback network to the second output port of said second coupler; and means for connecting the output port of said microwave signal feedback network to the second input port of said first coupler; said microwave signal feedback network feeding back a portion of the signal at the output port of said signal amplifying means to the input port of said signal amplifying means.

8. The microwave signal feedback amplifier of claim 7 wherein the first input port of said first coupler is direct current connected to the first output port of said first coupler, and the first input port of said second coupler is direct current connected to the first output port of said second coupler.

9. The microwave signal feedback amplifier of claim 8 wherein said microwave signal amplifying means comprises a microwave signal amplifier having an input terminal connected to the first output port of said first coupler, and output terminal connected to the first input port of said second coupler and a common terminal, and further comprising a bias voltage source connected to the first input port of said first coupler whereby a bias voltage is applied to the input terminal of said microwave signal amplifier via the direct current connection between the first input port and the first output port of said first coupler, and an operating voltage source connected to the first output port of said second coupler whereby an operating voltage is applied to the output terminal of said microwave signal amplifier via the direct current connection between the first output port and the first input port of said second coupler.

10. The microwave signal feedback amplifier of claim 8 wherein said microwave signal amplifying means comprises a microwave signal amplifier having at least an input terminal connected to the first output port of said first coupler, and an output terminal connected to the first input port of said second coupler, and further comprising an operating power source connected to at least the first output port of said second coupler whereby operating power is applied to at least one terminal of said microwave signal amplifier via a direct current connection through a coupler.

* * * * *